(12) United States Patent
Berberich

(10) Patent No.: US 8,354,754 B2
(45) Date of Patent: Jan. 15, 2013

(54) LAYERED CHIP FOR USE IN SOLDERING

(75) Inventor: Sven Berberich, Spardorf (DE)

(73) Assignee: Semikron Elektronik GmbH & Co., KG, Nürnberg (DE)

( * ) Notice: Subject to any disclaimer, the term of this patent is extended or adjusted under 35 U.S.C. 154(b) by 97 days.

(21) Appl. No.: 12/858,956

(22) Filed: Aug. 18, 2010

(65) Prior Publication Data
US 2011/0042831 A1 Feb. 24, 2011

(30) Foreign Application Priority Data
Aug. 18, 2009 (DE) .......................... 10 2009 028 621

(51) Int. Cl.
*H01L 23/48* (2006.01)
(52) U.S. Cl. .......... 257/779; 257/E21.476; 257/E23.023
(58) Field of Classification Search .................. 257/779, 257/E21.476, E23.023
See application file for complete search history.

(56) References Cited

U.S. PATENT DOCUMENTS

| 6,147,403 A | 11/2000 | Matschitsch et al. |
| 6,703,707 B1 | 3/2004 | Mamitsu et al. |
| 2008/0048177 A1 | 2/2008 | Besser et al. |

FOREIGN PATENT DOCUMENTS

| DE | 19603654 | * | 3/1997 |
| DE | 19 603 654 | | 7/1997 |
| DE | 19 734 434.8-33 | | 12/1998 |
| DE | 10 058 446.2 | | 5/2001 |
| JP | 3709117 | * | 10/2005 |
| JP | 2001284485 | | 10/2005 |

* cited by examiner

*Primary Examiner* — Long Pham
(74) *Attorney, Agent, or Firm* — The Law Offices of Roger S. Thompson

(57) ABSTRACT

A layer assemblage for a semiconductor chip having a chip body for producing a soldering connection for the chip. The assemblage is provided on a side of a chip body formed from a semiconducting material, wherein the layer assemblage is formed from a plurality of sequential metal layers which follow one above another and are produced by means of a physical coating method, and wherein a solderable soldering layer is provided between a noble metal layer situated at a surface of the layer assemblage and the chip body. In order to avoid an undesired penetration of a solder through the layer assemblage the soldering layer has at least one internal interface formed by an interruption of the coating method.

17 Claims, 1 Drawing Sheet

LAYERED CHIP FOR USE IN SOLDERING

BACKGROUND OF THE INVENTION

1. Field of the Invention

This invention is directed to a layered metal chip used to produce a soldering connection for a power semiconductor module.

2. Description of the Related Art

Known chips for producing power semiconductor modules are usually soldered onto a support, e.g. a Direct Copper Bonded ("DCB") substrate or a metallic plate, for heat dissipation purposes. Reference is made to Lugscheider E. et al. "Spannungsreduktion in Chip-DCB-Verbunden mittels Ausnutzung der intrinsischen Spannungseigenschaften von PVD-Metallisierungsschichten" ["Stress reduction in chip-DCB composite assemblies by means of utilization of the intrinsic stress properties of PVD metallization layers"], Verbundwerkstoffe and Werkstoffverbunde [Composite materials and materials composites], M. Schimmerer (ed.), 2005. Soldering connections may furthermore be necessary for producing electrical connections.

In order to produce the soldering connection, a layer assemblage formed from a plurality of metallic layers is provided on at least one side of the chip body. The layer assemblage is generally terminated by a noble metal layer, which prevents an undesired oxidation of the metallic layers situated therebeneath. A soldering layer is usually situated below the noble metal layer, which soldering layer, during the production of the soldering connection, at least partly melts together with the solder and, after solidification, fixedly connects the chip body to the support via further metallic layers connected to the soldering layer.

During the production of chip-DCB composite assemblies, in particular, it may be necessary to carry out a plurality of soldering operations. In this case, it may happen that the layer assemblage produced from the metallic layers, in particular, is heated repeatedly to a temperature of from about 200 to about 250° C. When a soldering connection that has already been produced is reheated, it can happen that a new melt forms from the soldering layer and the solder advances in the direction of the chip body and penetrates through further metallic layers of the layer assemblage in an undesirable manner. Consequently, voids or pores can form within the layer assemblage. Such voids or pores weaken the mechanical strength and/or electrical conductivity of the soldering connection.

SUMMARY OF THE INVENTION

It is an object of the invention to eliminate the disadvantages according to the prior art. In particular, the intention is to produce a chip which can be produced as simply and cost-effectively as possible and which can be reliably soldered. In particular, in the case of a multiple soldering, the intention is to ensure a soldering connection having a strong mechanical connection and good electrical conductivity.

In accordance with the invention, it is provided that the soldering layer has at least one interface formed by interrupting the performance of the coating method. It has surprisingly been found that such a soldering layer formed from a plurality of layers separated in each case by an internal interface makes it possible to prevent an undesired penetration of a melt formed from the soldering layer and a solder through subsequent metal layers applied on the substrate body. The inventive chip can be produced simply and cost-effectively. All that is necessary for this purpose is to interrupt the performance of the coating method during the production of the soldering layer, such that at least one internal interface is formed within a single soldering layer. A barrier forms within the soldering layer in the region of the internal interface, which barrier blocks an advance of a melt formed from the solder and the partly melted soldering layer in the direction of the chip body. As a consequence of this, contact of the melt with subsequent metal layers provided on the chip body does not occur or occurs only to a very small extent. An undesired formation of voids and/or pores within the layer assemblage, as caused by such contact, can thus be dependably and reliably avoided. The chip proposed is distinguished by a high process reliability, particularly in such production processes in which the chip is repeatedly exposed to temperatures in the range of from about 200 to about 250° C.

According to one advantageous configuration of the invention, a base layer of the layer assemblage, the base layer being in contact with the chip body, is formed substantially from aluminium. The base layer serves for linking the layer assemblage to the chip body.

According to a further advantageous configuration, a first intermediate layer, which is provided between the soldering layer and the base layer, is formed substantially from titanium or chromium or an alloy of titanium and tungsten. The first intermediate layer serves for promoting adhesion of a soldering layer applied thereto. It furthermore serves as a barrier for a melt formed from a solder and the soldering layer.

According to a further configuration of the invention, a second intermediate layer can be provided between the noble metal layer and the soldering layer, the second intermediate layer being formed substantially from titanium. The further intermediate layer contributes to further improvement of the process reliability.

The semiconducting material used for producing the chip body can be formed substantially from the following materials: Si, SiC, SiGe and GaAs.

According to a further advantageous configuration of the invention, it is provided that an average crystal size of the crystals forming the soldering layer initially increases in at least one direction facing away perpendicularly from the interface. In this case, the increase in the average crystal size can be abrupt or substantially continuous. According to a further configuration, an average crystal size of the crystals forming the soldering layer initially increases in a direction from a contact area, situated at a boundary with respect to a further metal layer, towards the interface. That is to say that the average crystal size advantageously has a maximum between the interface and the contact area. If a plurality of interfaces are formed within the soldering layer, the average crystal size can also have a maximum between two successive interfaces. Within the meaning of the present invention, the term "maximum" or "minimum" is understood respectively to be a relative maximum or minimum. That is to say that, for example, a plurality of maxima of an average grain size or the like can occur within the soldering layer perpendicularly to the interface.

The interface is a discontinuity horizon in the microstructure, which is observable using a scanning electron microscope, for example. The microstructure has a comparatively small average crystal size in the region of the interface at least on one side thereof. Furthermore, a frequency of pores contained in the soldering layer has a maximum in the region of the interface. The pores, in particular, contribute to the fact that a thermal conductivity, within the soldering layer, has a minimum in each case at an interface.

According to a further advantageous configuration, it is provided that the soldering layer is formed substantially from nickel or a nickel-vanadium alloy. However, it may also be the case that the soldering layer has at least two layers produced from different metals, wherein the metals are selected from the following group: Ni, Ti, W or a Ni/V alloy.

Advantageously, a thickness of the soldering layer is from about 0.7 to about 1.2 μm, preferably from about 0.8 to about 1.0 μm. The soldering layer is thus embodied with approximately just the same thickness as a soldering layer which has been used hitherto according to the prior art and which is produced in an uninterrupted coating operation. Despite the approximately same layer thickness as in the case of the soldering layer according to the prior art, the soldering layer according to the invention has a considerably improved resistance to penetration of a melt formed from the soldering layer and the solder.

The physical coating method for producing the soldering layer and/or the further metal layers is expediently a Physical Vapor Deposition ("PVD") or sputtering method. Preferably, a sputtering method is used in particular for producing the soldering layer. During the production of the soldering layer according to the invention, the physical coating method is interrupted in order to produce the at least one boundary layer, preferably a plurality of boundary layers, for about 1 to about 60 seconds in each case. During the interruption of the physical coating method, a previously deposited layer undergoes cooling. The cooling is in the range of from about 30 to about 100° C., preferably in the range of from about 40 to about 80° C. Due to the cooling, a reduced crystal growth occurs in the region of the subsequent interface.

The invention furthermore proposes a chip-substrate composite assembly, in which a chip according to the invention is connected to a substrate by means of a solder connected to the soldering layer. In this case, the solder engages into the soldering layer. During the production of the soldering connection, the soldering layer partly melts. An intermetallic compound forms between the solder and the soldering layer. By way of example, an alloy of tin and silver is used as the solder in this case. The alloy can be a constituent of a soldering paste. The substrate can be a metal plate, in particular also a heat sink.

The substrate can also be a DCB substrate. A "DCB substrate" is a "direct copper bonding" substrate which is known according to the prior art and on the surface of which a copper layer is provided. In the case of the chip-substrate composite assembly, the solder is in contact with a copper layer provided on the DCB substrate. Such substrates are used according to the prior art in particular for producing power semiconductor modules. In this case, the chips with their metallization provided thereon or with the layer assemblage are connected to the copper layer provided on the DCB substrate by means of soldering.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

An exemplary embodiment of the invention is described in greater detail below with reference to the drawings, in which.

DETAILED DESCRIPTION OF THE PRESENTLY PREFERRED EMBODIMENTS

Figure 1:
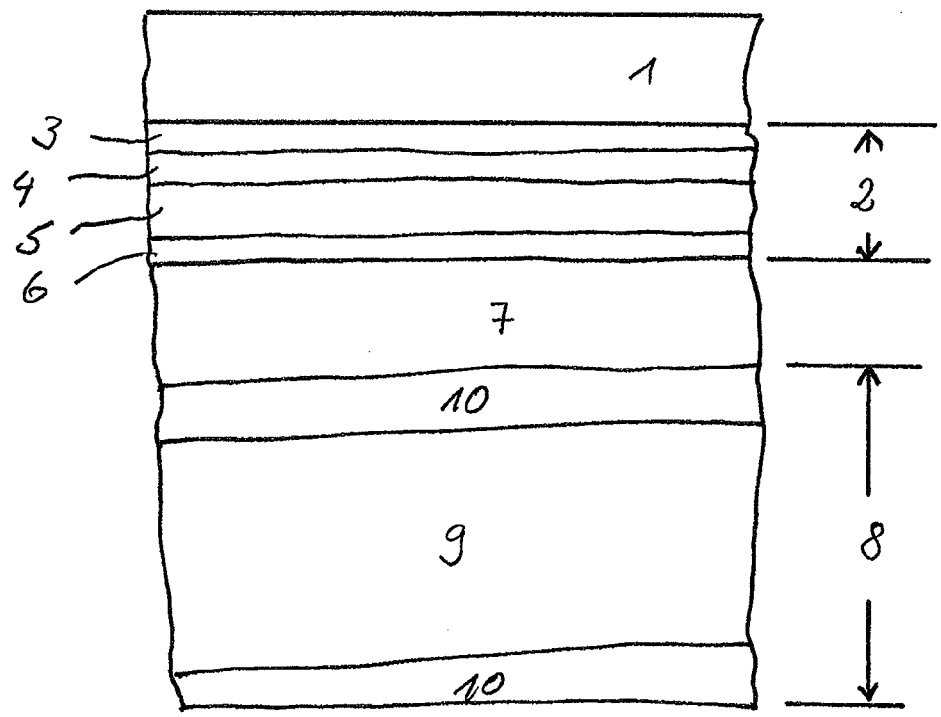
FIG. 1 shows a schematic layer view through an arrangement for producing a chip-DCB composite assembly.

FIG. 1 shows a stylized cross-sectional view through a DCB substrate with a chip arranged thereon, wherein a soldering paste is provided between the chip and the DCB substrate. A fixed composite assembly of the chip with the DCB substrate can be produced from such an arrangement by supplying heat.

In FIG. 1, a chip body, designated generally by 1, is produced from Si, for example. A metallization is provided at one side of chip body 1, the metallization being formed from a layer assemblage, designated generally by 2. Layer assemblage 2 consists of a plurality of sequential metallic layers produced by means of a suitable physical coating method, such as PVD or sputtering. A base layer 3 is formed substantially from Al. A first intermediate layer 4 deposited thereon can substantially consist of a TiW alloy. A soldering layer 5 consisting of a plurality of layers (shown in more detail in FIG. 2) is deposited on first intermediate layer 4. Each of the layers can be produced from Ni or an NiV alloy. A noble metal layer, which can be produced from Ag, Au, Pt or Pd, for example, is designed by the reference symbol 6.

A second intermediate layer (not shown) may be incorporated between soldering layer 5 and noble metal layer 6. The second intermediate layer can be produced from Ti, for example.

A soldering paste is designated by 7, soldering paste 7 substantially containing a solder produced from an alloy formed from Sn and Ag.

A DCB substrate is generally designated by 8. On a substrate body 9 produced from $Al_2O_3$, for example, copper layers 10 are respectively provided at the underside and top side of said substrate body.

Figure 2:
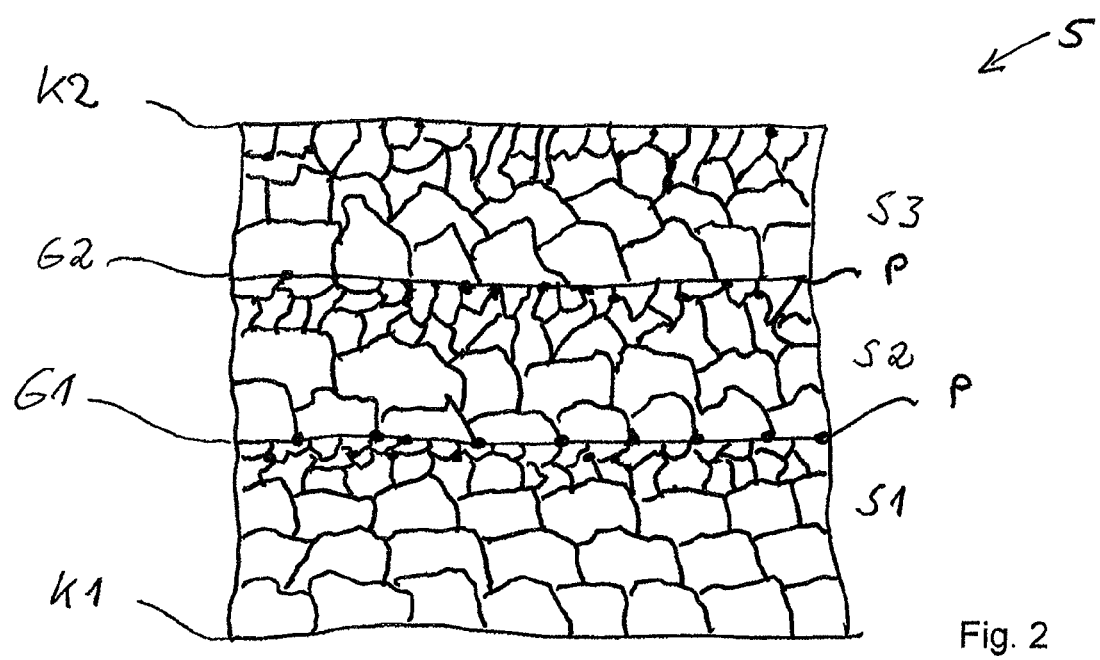
FIG. 2 shows a detail view of the arrangement of FIG. 1.

FIG. 2 shows a detail view of soldering layer 5. A lower contact area is designated by the reference symbol K1 and an upper contact area is designated by the reference symbol K2. A first layer S1 is bounded by first contact area K1 and a first interface G1, a second layer S2 is bounded by first interface G1 and also a second interface G2, and a third layer S3 is bounded by second interface G2 and also second contact area K2.

As can be seen from FIG. 2, an average crystal size is smaller in the region of interfaces G1, G2 than in an approximately central region between the interfaces G1 and G2 or between the interfaces G1 or G2 and the adjacent contact area K1 or K2. Furthermore, a frequency of pores P has a maximum particularly in the region of interfaces G1, G2. In particular, the crystals formed in the region of interfaces G1, G2 can extend in a column-like or fibre-shaped manner substantially perpendicular to interfaces G1, G2. By contrast, the crystals situated at a distance from interfaces G1, G2 can have a recrystallization structure. However, they can also be embodied in a column-like manner. The layers S1, S2, S3 are in this case expediently produced from the same metal, for example Ni or an NiV alloy. However, it is also possible for one or more of the layers S1, S2, S3 to be produced from different metals.

The structure shown in FIG. 2 can be implemented by means of a sputtering method, for example. In order to produce interfaces G1, G2, the sputtering method is expediently interrupted for a duration of, for example, 20 to 50 seconds. In this case, the layer S1, S2 or S3 that has been deposited up to that point can cool for example around a temperature in the range of 40 to 70° C.

The sputtering method is subsequently continued under the same conditions as during the deposition of the previous layers S1, S2.

A thickness of the layers S1, S2, S3 forming the soldering layer 5 is expediently in the range of 0.2 to 0.4 µm. According to one particularly advantageous configuration, the soldering layer 5 is formed from three layers, each having a thickness of from about 0.25 µm to about 0.35 µm.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A layer assemblage for use in providing a soldering connection to a semiconductor chip having a chip body, the assemblage comprising:
   a plurality of sequential metal layers, at least one of which is formed substantially of a noble metal situated at a surface of the layer assemblage; and
   a soldering layer disposed between said noble metal layer and the chip body, wherein said soldering layer is discontinuous, and contains an internal interface within said soldering layer;
   wherein said soldering layer is formed of crystals, and an average crystal size of the crystals forming the soldering layer initially increases in a direction facing away substantially perpendicularly from said internal interface and from a contact area situated at a boundary with respect to a subsequent metal layer.

2. The layer assemblage of claim 1, further comprising a base layer disposed in contact with the chip body.

3. The layer assemblage of claim 2, wherein said base layer is formed substantially from aluminum.

4. The layer assemblage of claim 2, further comprising a first intermediate layer disposed between said soldering layer and said base layer.

5. The layer assemblage of claim 4, wherein said first intermediate layer is formed substantially from one of the group consisting of: Ti, Cr and an alloy of Ti and W.

6. The layer assemblage of claim 1 further comprising a second intermediate layer disposed between said noble metal layer and said soldering layer.

7. The layer assemblage of claim 6 wherein said second intermediate layer is formed substantially from Ti.

8. The layer assemblage of claim 1, wherein said soldering layer includes pores, and a frequency of said pores has a maximum in the region of said internal interface.

9. The layer assemblage of claim 1, wherein said soldering layer is formed substantially from one of Ni or an Ni/V alloy.

10. The layer assemblage of claim 1, wherein said soldering layer has at least two layers produced from different metals, wherein said different metals are selected from the group consisting of: Ni, Ti, W or a Ni/V alloy.

11. The layer assemblage of claim 1, wherein said soldering layer has a thickness of from about 0.7 to about 1.2 µm.

12. The layer assemblage of claim 11, wherein said thickness of said soldering layer is from about 0.8 to about 1.0 µm.

13. A chip assembly comprising:
    a semiconductor chip having a chip body; and
    a layer assemblage for use in providing a soldering connection to said semiconductor chip, said assemblage having:
    a plurality of sequential metal layers, at least one of which is formed substantially of a noble metal situated at a surface of the layer assemblage; and
    a soldering layer disposed between said noble metal layer and the chip body, wherein the soldering layer is discontinuous, and contains an internal interface within said soldering layer;
    wherein said soldering layer is formed of crystals, and an average crystal size of the crystals forming the soldering layer initially increases in a direction facing away substantially perpendicularly from said internal interface and from a contact area situated at a boundary with respect to a subsequent metal layer.

14. The chip assembly of claim 13, wherein said semiconductor is substantially formed from a material from the group consisting of: Si, SiC, SiGe, GaAs.

15. The chip assembly of claim 13, wherein said chip is connected to a substrate by means of a solder connected to said soldering layer.

16. The chip assembly of claim 13, wherein said substrate is a DCB substrate, and said solder is in contact with a copper layer provided on said DCB substrate.

17. The chip assembly of claim 15, wherein said solder is produced from an alloy formed substantially from Sn and Ag.

* * * * *